United States Patent [19]

Ehret et al.

[11] 4,338,546

[45] Jul. 6, 1982

[54] LIQUID LEVEL DETECTION CIRCUIT FOR CONTROL OF LIQUID LEVEL RESPONSIVE DEVICE

[75] Inventors: Gordon F. Ehret, Alhambra; William N. Rowley, Palos Verdes Estates; Richard E. Mullen, Tustin, all of Calif.

[73] Assignee: The Marley-Wylain Company, Mission Woods, Kans.

[21] Appl. No.: 210,235

[22] Filed: Nov. 25, 1980

[51] Int. Cl.³ .......................................... H05B 37/00
[52] U.S. Cl. .................................. 315/119; 307/308; 307/252 B; 315/DIG. 4; 73/304 R; 340/618; 367/908
[58] Field of Search ........................ 315/119, DIG. 5; 307/252 B, 252 T, 308

[56] References Cited

U.S. PATENT DOCUMENTS

| | | | |
|---|---|---|---|
| 3,486,042 | 12/1969 | Watrous | 307/252 B |
| 3,619,656 | 11/1971 | Domke | 307/252 T |
| 3,700,002 | 11/1973 | Brown . | |
| 3,732,556 | 5/1973 | Caprillo . | |
| 3,746,877 | 7/1973 | Lorenz | 317/252 B |
| 3,914,592 | 10/1975 | Maxey | 307/252 B |
| 3,916,213 | 10/1976 | Luteran . | |
| 3,994,845 | 3/1976 | Luteran . | |
| 4,105,367 | 8/1978 | Francis . | |
| 4,113,312 | 9/1978 | McGalliard . | |
| 4,216,411 | 8/1980 | Ehret et al. | 315/119 |
| 4,234,819 | 11/1980 | Maxey | 315/119 |

*Primary Examiner*—Harold A. Dixon
*Attorney, Agent, or Firm*—Schmidt, Johnson, Hovey & Williams

[57] ABSTRACT

A liquid level presence detection circuit includes a selectively gatable TRIAC serially connected with a load and triggered into conduction by twin sensitive-gate SCR's connected anode-to-cathode with the gates of the SCR's connected to voltage divider circuits which provide gating current to the SCR's in response to the presence of a conductive liquid bridging the two spaced apart contacts of a liquid presence detecting probe. The circuit is used in wet-niche type lamp assemblies that provide underwater illumination in swimming pools and the like and in which cooling is effected by the surrounding liquid. The detection circuit advantageously interrupts the flow of electrical energy to the lamp when the level of surrounding liquid falls below a predetermined level to prevent over-temperature operation of the lamp and consequent damage thereto and resumes the flow of electrical energy to the lamp when the level of the surrounding liquid increases to a safe level to permit adequate cooling thereof.

12 Claims, 5 Drawing Figures

4,338,546

LIQUID LEVEL DETECTION CIRCUIT FOR CONTROL OF LIQUID LEVEL RESPONSIVE DEVICE

BACKGROUND OF THE INVENTION

The present invention relates to electrical circuits for detecting the presence or absence of a liquid and, more particularly, to a liquid presence detection circuit for control of a wet-niche type lamp assembly that is surrounded by and cooled by a liquid, the circuit interrupting power to the lamp when the level of the surrounding, cooling liquid falls below a predetermined safe level.

Various mechanical and electronic devices are known for detecting the presence or level of a liquid and operating a controlled device such as a pump, lamp, or alarm in response thereto. Typically, the mechanical devices have included a float that is operatively associated with a switch with the float actuating the switch in response to the level of the liquid. Electronic devices have included photo-optical detector circuits, thermistor-based detection circuits, and conductivity detectors which detect the presence or absence of the liquid based on optical, thermal, and conductivity characteristics of the liquid being sensed.

One application for electronic liquid detecting circuits is in controlling wet-niche type lamps which provide underwater illumination for swimming pools, fountains, and the like. In this type of illuminating lamp, the surrounding water or liquid absorbs the excess heat energy generated by the lamp filament to maintain the lamp and its housing in a preferred temperature range. Should the level of the surrounding, cooling water inadvertently drop below the level of the operating lamp, the heat energy generated by the filament that would normally be transferred to the surrounding water can cause the temperature of the lamp and its housing to increase and thereby cause an over-temperature condition. Repeated or extended over-temperature operation can materially reduce the operating life of the lamp filament, cause distortion and stress in various parts of the lamp and lamp housing, and cause many plastic parts, including plastic sealing gaskets, structural elements, and electrical insulating parts to distort, crack, or embrittle. Should the level of the cooling water be restored while the lamp is in such an over-temperature condition, the resultant thermal shock can cause further material and structural deterioration, stress, and damage to the lamp and its housing.

Prior liquid presence circuits used in wet-niche type lamps have used electronic liquid level detection circuits that interrupt the flow of electricity to the lamp to prevent low-liquid operation and consequent over-temperature condition. These circuits have typically included a selectively gatable thyristor in series with the lamp filament with the thyristor gated by a circuit that includes a capacitive impedence. While circuitry of this type is reasonably reliable and efficient in operation, the capacitive impedence in the gate circuit causes a firing angle delay in providing electrical energy to the lamp, and capacitors, as a component, are subject to variation in performance with age as well as having a higher failure rate than other electronic components.

SUMMARY OF THE INVENTION

In view of the above, it is a broad overall object of the present invention, among others, to provide a sensitive and reliable, yet inexpensive and simple, circuit for detecting the presence or absence of a liquid for operating a controlled device.

It is another object of the present invention to provide a sensitive and reliable circuit for controlling a wet-niche type illuminating lamp to discriminate between the presence or absence of surrounding, cooling water for the lamp.

It is still another object of the present invention to provide a normally submerged illuminating lamp structure having a circuit which interrupts the flow of electrical energy to the lamp when the level of the surrounding water drops below a predetermined level and resumes the flow of electrical energy to the lamp when the level of surrounding water rises to the predetermined level.

It is still another object of the present invention to provide a normally submerged illuminating lamp structure which is cooled by surrounding water and which is protected against over-temperature operation when the level of the cooling water drops below a predetermined level.

In accordance with these objects, and others, the present invention provides a liquid presence detection circuit for operating a liquid-presence responsive load, such as a wet-niche type underwater illuminating lamp, from an alternating current source. The circuit includes a selectively gatable bi-directionally conductive thyristor serially connected with the load and triggered into conduction by a gating circuit that includes twin, sensitive-gate SCR's connected back-to-back with the gates of the SCR's connected to a voltage divider circuit that includes two spaced apart contacts of a liquid detection probe adapted to contact the detected liquid. When the two contacts are bridged by the liquid under detection, the conductivity characteristic of the detected liquid changes the current through the voltage divider circuit so that the SCR's are gated on respective alternations of the supply current to thereby trigger the thyristor into conduction. In the wet-niche lamp environment, when the level of the surrounding cooling liquid drops below the level of the probe, the circuit interrupts the flow of electrical energy to the illuminating lamp to prevent an over-temperature condition and consequent damage to the lamp.

The circuit advantageously eliminates or diminishes the disadvantages associated with the prior use of a capacitive impedance in the gating circuit of the thyristor including the conduction time delay on each alternation of the supply current and the time dependent change in capacitor characteristics.

BRIEF DESCRIPTION OF THE DRAWINGS

The above description as well as further objects, features, and advantages of the present invention will be more fully understood by reference to the following description of presently preferred but nonetheless illustrative embodiments in accordance with the present invention, when taken in connection with the accompanying drawings, wherein.

DESCRIPTION OF THE PREFERRED EMBODIMENT

Figure 1:
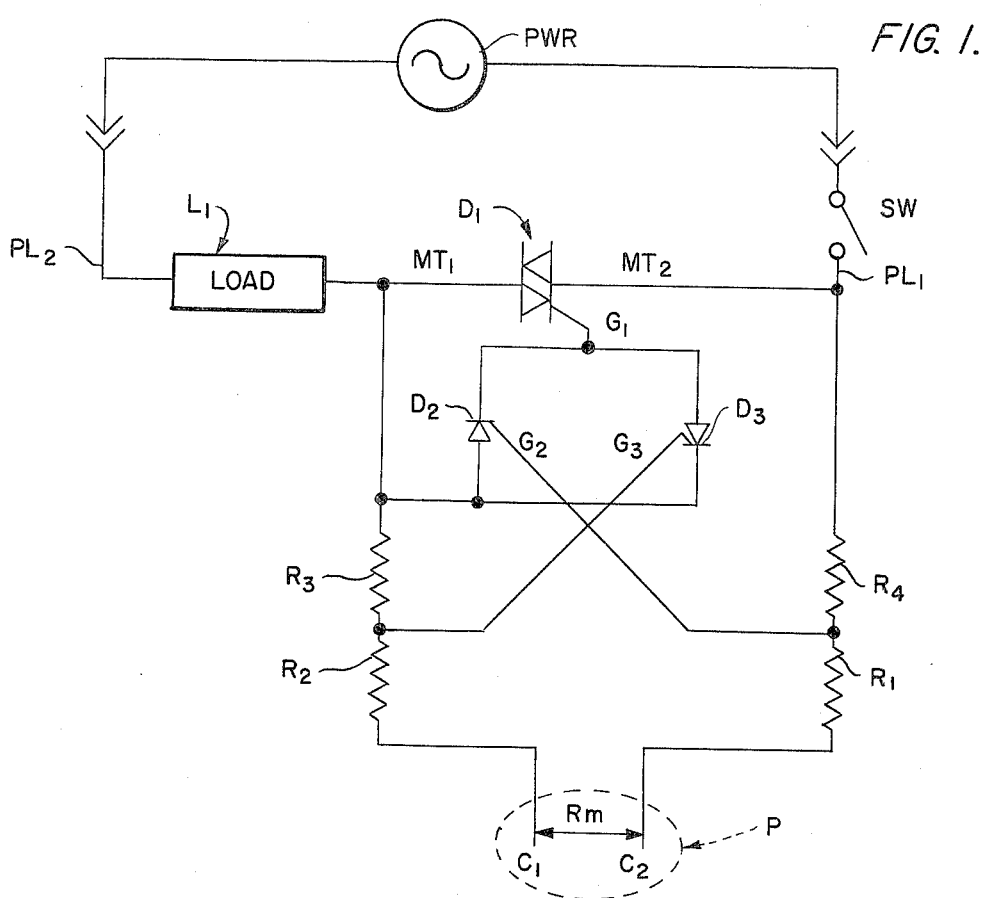
FIG. 1 is a schematic diagram of a liquid-level detection circuit in accordance with the present invention.
Figure 2:
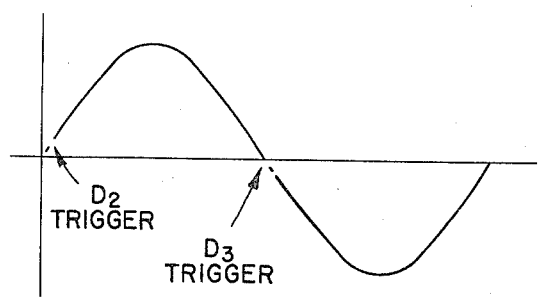
FIG. 2 is a graphical illustration of positive and negative alternation wave form indicating which of the elements of the circuit of FIG. 1 effect conduction.

A liquid presence or level detection circuit in accordance with the present invention is shown in FIG. 1 and includes a selectively gatable thyristor or TRIAC D1 serially connected with the load L1 (e.g., the filament of an illuminatable lamp) across two power-providing conductors PL1 and PL2. The power source is shown diagrammatically as an alternating current source connectable to the serially connected TRIAC D1 and load L1 through a single-pole single-throw switch SW. The TRIAC D1 includes a terminal MT1 connected to the load L1, a terminal MT2 connected to the power line PL1, and a gate terminal G1. The TRIAC D1 is triggered into conduction by a triggering circuit which includes SCR's D2 and D3 connected in a "back-to-back" configuration, that is, the cathode of the SCR D2 is connected to the anode of the SCR D3 with this junction being connected to the gate terminal G1 of the TRIAC D1 and the cathode of the diode D3 connected to the anode of the diode D2 with this junction connected to the terminal MT1 of the TRIAC D1. The terminal MT1 is also connected to a first voltage divider circuit that include serially connected resistors R2 and R3 and the terminal MT2 is connected to a second voltage divider circuit that includes serially connected resistors R1 and R4. The intermediate point of the first voltage divider (that is, the junction between the resistors R2 and R3) is connected to the gate terminal G3 of the SCR D3 while the intermediate point of the second voltage divider (that is, the resistors R1 and R4) is connected to the gate terminal G2 of the SCR D2. The resistors R1 and R2 are connected, respectively, to contacts C1 and C2 that define the liquid level or presence detecting probe P.

In operation, alternating electrical power is applied to the circuit by closing the power switch SW. When the liquid presence probe P is not in contact with a liquid, the resistance $R_m$ between the contacts C1 and C2 is very high and approaches infinity. On the other hand, when the liquid presence detecting probe P is positioned so that it can come into contact with a liquid, for example, a liquid in a swimming pool or a storage tank, the resistance $R_m$ between the contacts C1 and C2 of the probe P will drop as the liquid bridges the contacts with the resistance or impedence being a function of the contact spacing and the conductivity of the liquid. When the contacts C1 and C2 are bridged by the liquid, the current path is established through the serially connected load L1, the first voltage divider resistors R3 and R2, the inter-contact impedance or resistance $R_m$ of the probe (which inter-contact impedance is a function of the contact separation and the conductivity of the liquid), and the second voltage divider circuit R1 and R4 with voltage drops across each of these resistances being developed in accordance with the value of the resistance and the instantaneous magnitude of the applied electrical power.

When the power line PL2 is positive relative to the power line PL1 (that is, on a positive alternation of the AC cycle) a relative positive voltage is developed at the intermediate connection between the resistors R1 and R4 with this relative positive voltage being sufficient to trigger and then latch the diode D2 into conduction. Thereafter, the current in the gate circuit of the TRIAC D1 increases to the point where the TRIAC is triggered into conduction to cause a flow of current to the load. This flow current continues until the electrical power on the first alternation of the AC cycle diminishes toward zero at which time current ceases. On the next successive alternation, (that is, when the power line PL2 is negative relative to the power line PL1) the voltage of the junction of the voltage dividers R2 and R3 will increase to the point where the SCR D3 is triggered into and latches into conduction to cause a current flow in the gate circuit of the TRIAC D1 to then cause the TRIAC to conduct on the next successive alternation of the power cycle.

The SCR's D2 and D3 are of the type known as "sensitive-gate" SCR's in that the gate current necessary to trigger conduction is generally between 20 and 200 microamps as distinguished from more conventional SCR's which traditionally require a higher triggering gate current. By providing SCR's of the aforementioned type, the SCR's D2 and D3 will trigger the TRIAC D1 very near the cross-over point (that is, a firing angle generally between 2° and 3°) to very desirably limit the current at switching to minimize RFI developed and the switching loads applied through the TRIAC D1. Suitable "sensitive-gate" SCR's for this purpose are P/N 2N5064 manufactured by the General Electric Company.

The afore-described circuit also possesses a fail safe feature in that the electrical power is supplied through the load L1, and in the event that the load opens, the circuit will be disabled from operation since power will not be supplied through the first and second voltage dividers.

The afore-described circuit also eliminates the traditionally used capacitive impedance in the thyristor gating circuit to provide a circuit that is comprised of solid-state components. Thus, the disadvantages associated with the prior use of capacitors, namely, a failure rate higher than solid-state components and variation of the capacitance parameter with time, are diminished or eliminated.

Figure 3:
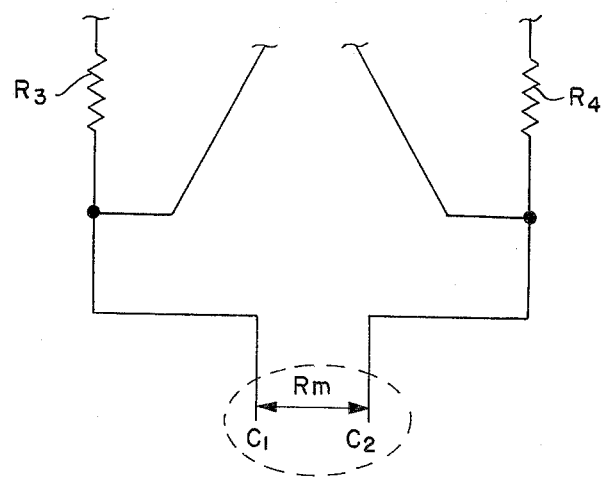
FIG. 3 is a schematic diagram of a variation of the liquid-level detection circuit shown in FIG. 1.

A variation of the circuit of FIG. 1 is shown in FIG. 3. As shown therein, the resistors R1 and R2 have been eliminated so that the series resistance path for providing the trigger voltage for the TRIAC D1 includes only the resistance of the load L1 and the resistances of $R_3$, $R_m$, and $R_4$. The elimination of the resistors R1 and R2 permits higher voltages to be available at the contacts C1 and C2 of the probe P for those liquids that have a very low conductivity.

Figure 4:
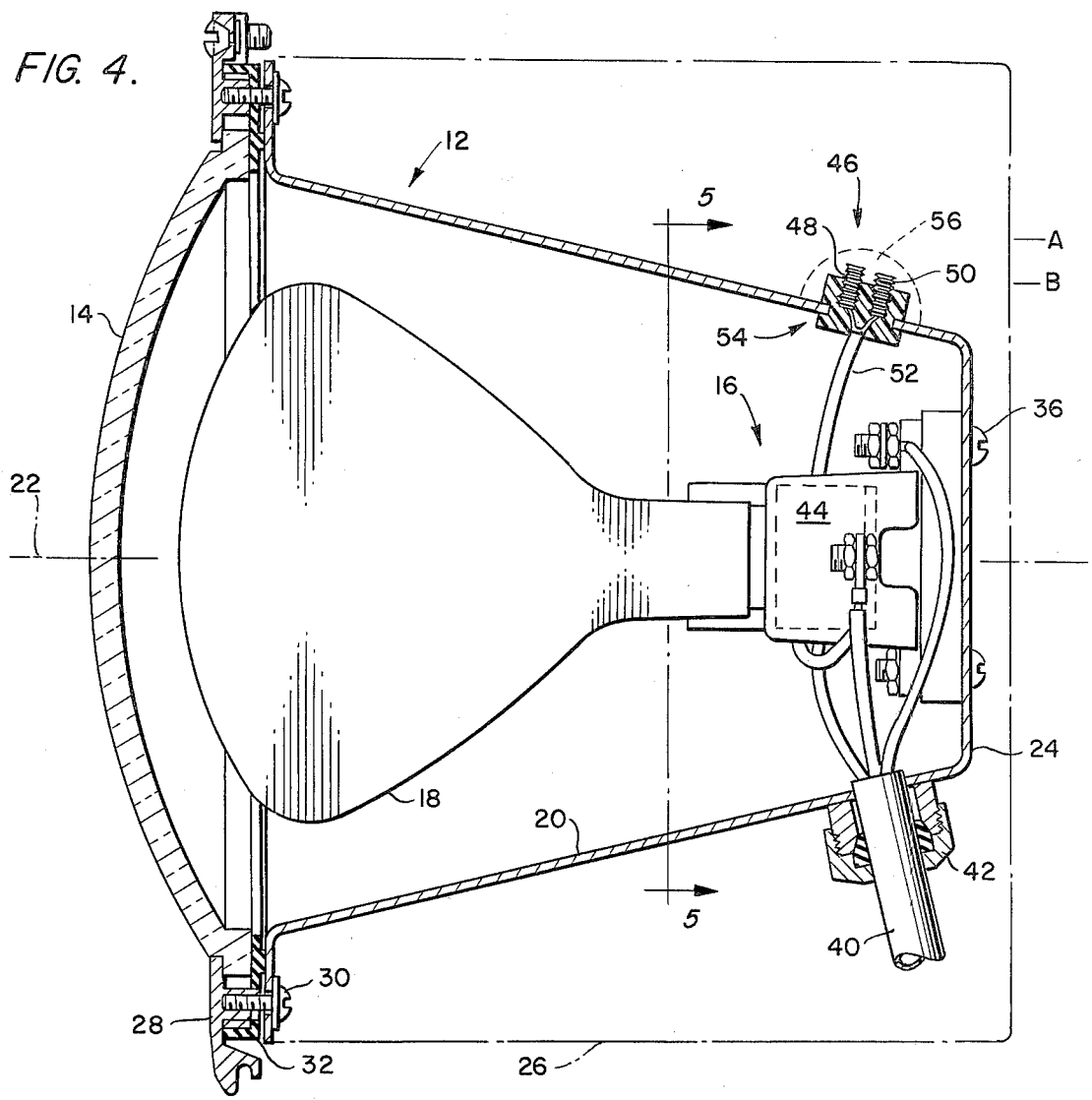
FIG. 4 is a side elevation view, in partial cross section, of an exemplary underwater illuminating lamp of the wet-niche type incorporating the circuit of FIG. 1 to provide low-water cut-off protection.
Figure 5:
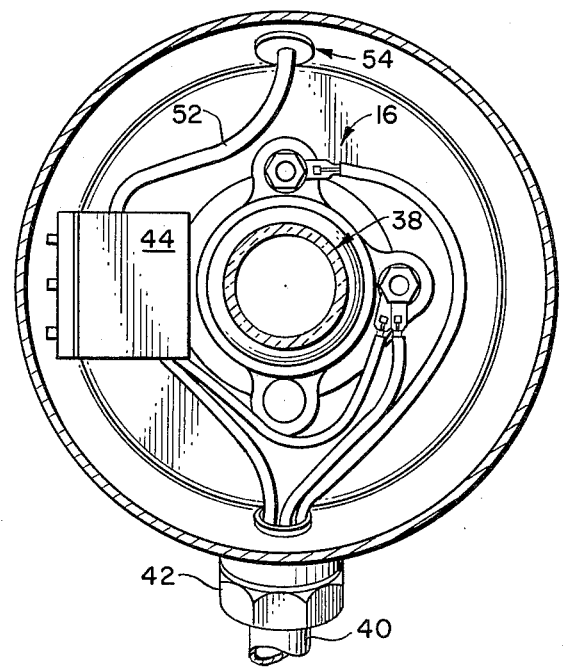
FIG. 5 is a cross-sectional view of the lamp shown in FIG. 4 taken along line 4—4 thereof.

The circuits of FIGS. 1 and 3 have numerous applications for detecting the presence or absence of a liquid; the preferred application, as described below, being for use as a low-water cut-off circuit in an underwater wet-niche lamp structure. An exemplary lamp structure is shown in FIGS. 4 and 5 and includes a shell 12, a transparent lens 14, a lamp holder assembly 16, and an illuminating lamp 18 of conventional design.

The shell 12 includes a frusto-conical sidewall 20 formed as a surface of revolution about the longitudinal axis 22 with the smaller diameter end of the shell 12 closed by an end wall 24 which end wall and sidewall may be formed as a unitary structure. The shell 12 is mounted, for example, in a cavity formed in the sidewall (not shown) of a swimming pool with the open, wider-end of the shell facing the interior of the pool. In FIG. 1, the cavity wall is schematically represented by the broken line 26. The shell 12 may be maintained in place by suitable means (not shown) such that the water from the pool, when normally filled, occupies space between the shell 12 and cavity wall 26. The transparent lens 14 is located at the open, wider-end of the shell 12 and is held in place by a lens retainer 28 and suitable threaded fasteners 30. A sealing gasket 32 is located between the rim of the lens 14 and radially outward extending flange 30 of the shell 12 to maintain a water-tight seal between the lens 14 and the shell 12.

The lamp holder assembly 16 is located at the narrow, closed end of the shell 12 and is secured in place by suitable threaded fasteners 36 passing through holes (not shown) formed in the end wall 24 and engaging threaded bores in the body of the lamp holder assembly. The illuminating lamp 18, which may be in the form of a conventional incandescent lamp, is threaded into the lamp socket 38 such that it faces the interior of the pool. Electrical power for the lamp 18 is provided through a power cable 40 which passes through a water-tight fitting 42 into the interior of the shell 12. The power cable 40 includes a plurality of wires connected to various terminals on the lamp holder assembly 16 and to a control circuit module 44 which includes the circuitry of FIG. 1. The lamp holder assembly 16 and the control circuit module 44 are both preferably encapsulated in a water-proof potting compound to protect the lamp assembly 16 from the water.

A liquid level presence detecting probe 46 is located on the exterior of the shell 12 and is designed to sense the presence or absence of water in the space within the shell and in the cavity wall 26. The probe 46 includes the two contacts C1 and C2 spaced apart a selected distance. In the preferred embodiment, contacts C1 and C2 take the form of removable set screws 48 and 50, respectively, that are exposed on the one side to the water and connected on the other side to a cable 52 connected to the resistances R1 and R2. By having removable set screws as the contacts C1 and C2, it is possible to periodically remove the set screws to replace them in the event of corrosion or electrolytic deterioration. The contacts C1 and C2 are suitably mounted in a water tight fitting 54 to prevent water from entering into the interior of the shell 12. If preferred, an apertured dome or shield 56 (broken line illustration) may be provided to protect the contacts C1 and C2.

The liquid presence probe P is designed to sense the presence or absence of the surrounding, cooling water and, in cooperation with the circuit shown in FIG. 1, interrupt the flow of electrical power to the lamp 18 when the water level drops below a predetermined level. When the level of the cooling water in the cavity 26 is at or above the level of the probe, that is, at or above level A in FIG. 4, the water bridges the space between the contacts C1 and C2 of the probe P to complete the above-described current path through the load L1 (lamp 18), and the resistances R2, R3, $R_m$, R1, and R4 to permit gating voltages to be applied to the SCR's D2 and D3 which in turn trigger the TRIAC D1 on alternate alternations of the AC waveform to provide continuous power to the lamp 18. On the other hand, when the level of the cooling water in the cavity 26 drops below the level of the probe P, that is, to the level B shown in FIG. 4, the water no longer bridges the space between the contacts C1 and C2 of the probe P and, accordingly, the inter-contact resistance $R_m$ of the probe increases toward infinity with the result that the above described current path is effectively interrupted to prevent the generation of the necessary gating voltages for the SCR's D2 and D3 and the triggering of the TRIAC D1; accordingly, the lamp 18 will remain in the off state until such time that the level of the surrounding cooling water rises above the level of the probe P to span or bridge the contacts C1 and C2.

As can be appreciated from the above, the aforedescribed circuit uses only semi-conductor components to effect its operation, which components have high reliability when compared to other circuits in which a capacitive element is used for triggering the thyristor(s). In addition, the voltage divider circuits consisting of the resistors R2, R3, R1 and R4 can be varied to suit liquids of varying conductivities.

While the present invention has been described in the context of an underwater lamp for illuminating a swimming pool, the circuit can also be used for controlling of the devices in response to low or high water level alarms, pumps, and the like.

As apparent to those skilled in the art, various changes and modifications may be made to the liquid detection circuit of the present invention without departing from the spirit and scope of the invention as described in the appended claims and their legal equivalent.

What is claimed is:

1. A liquid presence detection circuit for detecting the presence or absence of a liquid and controlling a load in response thereto, said circuit comprising:

a triggerable thyristor in series circuit with a load, said thyristor/load series circuit connectible across a source of alternating-current power, said thyristor triggerable into conduction to cause a flow of power through the load in response to a trigger signal applied to a trigger input thereof;

a trigger circuit for triggering said thyristor including first and second SCR's connected anode-to-cathode with a first of said anode-to-cathode connections connected to said trigger input and another of said anode-to-cathode connections connected to said thyristor/load series circuit, each of said SCR's including a gate input, the gate inputs of said SCR's connected, respectively, to first and second spaced apart contacts exposed to the liquid to effect detection thereof; and resistance means connected to said thyristor/load circuit and said first and second contacts to provide a voltage potential thereacross;

whereby the presence of a liquid bridging said first and second contacts causes successive gating of the SCR's to thereby trigger the thyristor into conduction.

2. The liquid presence detection circuit claimed in claim 1 wherein said resistance means comprises a first resistor connected between one of said contacts and the junction between said thyristor and said load, and a second resistor connected between the second of said contacts and the source of power.

3. The liquid presence detection circuit claimed in claim 1 wherein said resistance means comprises first and second serially connected resistors connected between the first of said contacts and the junction between said thyristor and said load and third and fourth serially connected resistors connected between the second of said contacts and the source of power, the gates of said SCR's connected, respectively, to the junction between said first and second resistors and the junction between third and fourth resistors.

4. A liquid presence detection circuit for detecting the presence or absence of a liquid and controlling a load response thereto, said circuit comprising:

a selectively triggerable thyristor serially connected with a load, one side of said thyristor/load series circuit connected to one side of a source of alternating power and the other side thereof connected to the other side of the source of alternating power, said thyristor triggered into conduction in response to a trigger voltage applied to a trigger input thereof;

a liquid presence probe including at least first and second spaced apart electrical contacts, said first contact connected to one side of said thyristor/load series circuit through a first voltage divider circuit and said second contact connected to the other side of said thyristor/load series circuit through a second voltage divider circuit;

both said first and said second voltage divider circuits including at least first and second series connected resistance elements; and a trigger circuit for triggering said thyristor into conduction in response to the presence of a liquid between said first and said second contacts of said probe to thereby provide electrical energy to said load, said triggering circuit including a first SCR and a second SCR, said first and second SCR's connected anode-to-cathode with one of said anode-to-cathode connections connected to the trigger input of said thyristor and the other of said anode-to-cathode connections connected to the other side of said thyristor/load series circuit;

a gate input of said first and said second SCR's connected, respectively, to intermediate points of said first and said second voltage divider circuits.

5. The detection circuits claimed in claim 1 or claim 4 wherein said SCR's are of the "sensitive-gate" type having a gating current requirement of less than 250 microamps.

6. A liquid cooled, wet-niche lamp structure for providing underwater illumination in a liquid-containing pool or the like and protected against over-temperature operation incident to a low-liquid condition, said lamp structure comprising:

a lamp housing adapted to receive an illuminatable lamp therein;

said lamp adapted to be supported in heat exchange relationship with a surrounding liquid media to effect cooling thereof and having a power circuit for connection to an alternating source of electrical power;

a liquid presence probe exposed to the liquid including first and second spaced apart contacts for detecting the presence or absence of a liquid, control circuit means connected to said liquid presence probe and the lamp for providing electrical power to the lamp in the presence of the liquid cooling media and interrupting the flow of electrical power to the lamp in the absence of the liquid cooling media, said control circuit including a triggerable thyristor in series circuit with the lamp, said thyristor/lamp series circuit connectible across the power circuit, said thyristor triggerable into conduction to cause a flow of power through the lamp in response to a trigger signal applied to a trigger input thereof;

a trigger circuit for triggering said thyristor including first and second SCR's connected anode-to-cathode with the first of said anode-to-cathode connections connected to said trigger input and the other of said anode-to-cathode connections connected to said thyristor/lamp series circuit, each of said SCR's including a gate input, the gate input of said SCR's connected, respectively, to first and second spaced apart contacts; and resistance means connected to said thyristor/lamp circuit and said first and second contacts to provide a voltage potential across said first and second contacts;

whereby the presence of a liquid bridging said contacts successfully gates the SCR's to thereby trigger the thyristor into conduction.

7. The liquid cooled wet-niche lamp structure claimed in claim 6 wherein said resistance means comprises a first resistor connected between one of said contacts and the junction between said thyristor and the lamp and a second resistor connected between the second of said contacts and said power circuit.

8. The liquid cooled wet-niche lamp structure claimed in claim 6 wherein said resistance means comprises first and second serially connected resistors connected between the first of said contacts and the junction between said thyristor and said lamp and third and fourth serially connected resistors connected between the second of said contacts and said power circuit, the gates of said SCR's connected, respectively, to the junction between said first and second resistors and the junction between said third and fourth resistors.

9. A liquid cooled, wet-niche lamp structure for providing underwater illumination in a liquid containing pool or the like and protected against over temperature operation incident to a low-liquid condition, said lamp structure comprising:

a lamp housing adapted to receive an illuminatable lamp therein;

said lamp adapted to be supported in heat exchange relationship with a surrounding liquid media to effect cooling thereof and having a power circuit for connection to an alternating source of electrical power;

control circuit means for providing electrical power to the lamp in the presence of the liquid cooling media and interrupting the flow of electrical power to the lamp in the absence of the liquid cooling media, said control circuit including a selectively triggerable thyristor serially connected with said lamp, one side of said thyristor/lamp series circuit connected to one side of the source of power and the other side thereof connected to the other side of the source of power, said thyristor triggered into conduction in response to a trigger voltage applied to a trigger input thereof;

a liquid presence probe including at least first and second spaced apart electrical contacts, said first contact connected to one side of said thyristor/- lamp series circuit through a first voltage divider circuit and said second contact connected to the other side of said thyristor/lamp series circuit through a second voltage divider circuit;

both said first and second voltage divider circuit including at least first and second series connected resistance elements; and a trigger circuit for triggering said thyristor into conduction in response to the presence of a liquid between said first and said second contacts of said probe to thereby provide electrical energy to said lamp, said triggering circuit including a first SCR and a second SCR, said first and said second SCR's connected anode-to-cathode with one of said anode-to-cathode connections connected to the trigger input of said thyristor and the other of said anode-to-cathode connections connected to the other side of said thyristor/lamp series circuit, a gate input of said first and said second SCR's connected, respectively, to intermediate points of said first and said second voltage divider circuits.

10. The liquid cooled wet-niche lamp structure claimed in claim 9 wherein said probe is mounted in said housing and said contacts comprise first and second removable threaded fasteners exposed to said liquid.

11. The wet-niche lamp structure claimed in claim 10 further comprising:

a liquid permeable shield mounted over said first and second threaded fasteners.

12. The liquid cooled wet-niche lamp claimed in claims 6 or 9 wherein said SCR's are of the "sensitive-gate" type having a gating current requirement of less than 250 microamps.

* * * * *